United States Patent [19]
Dranchak et al.

[11] Patent Number: 4,892,487
[45] Date of Patent: Jan. 9, 1990

[54] CONNECTOR ASSEMBLY WITH MOVABLE CARRIAGE

[75] Inventors: David W. Dranchak, Endwell; David E. Engle, Vestal; Alan D. Knight, Newark Valley, all of N.Y.

[73] Assignee: IBM Corporation, Armonk, N.Y.

[21] Appl. No.: 366,848

[22] Filed: Jun. 15, 1989

[51] Int. Cl.⁴ .............................................. H01R 9/09
[52] U.S. Cl. ..................................... 439/260; 439/62; 439/630
[58] Field of Search ............... 439/260, 493, 492, 259, 439/261, 267, 329, 630, 632, 635, 62, 59, 67

[56] References Cited
U.S. PATENT DOCUMENTS

| | | | |
|---|---|---|---|
| 4,261,631 | 4/1981 | Guilcher et al. | 439/260 |
| 4,416,497 | 11/1983 | Brandsness et al. | 439/492 |
| 4,480,884 | 11/1984 | Babuka et al. | 439/59 |
| 4,556,268 | 12/1985 | Noschese | 439/267 |
| 4,626,056 | 12/1986 | Andrews, Jr. et al. | 439/260 |
| 4,629,270 | 12/1986 | Andrews, Jr. et al. | 439/260 |
| 4,636,019 | 1/1987 | Gillett et al. | 439/260 |
| 4,717,345 | 1/1988 | Gordon et al. | 439/67 |
| 4,744,764 | 5/1988 | Rubenstein | 439/62 |

OTHER PUBLICATIONS

IBM TDB, vol. 26, No. 12, May. 1984, "Flex Circuit Zero Insertion Force Connector", A. Burke, pp. 6657.
IBM TDB, vol. 26, No. 12, (5/84), "Combined Action Zero Insertion Force Connector", K. Hinrichsmeyer, E. Stadler, R. Stahl and W. Straehle, pp. 6647-6478.

*Primary Examiner*—William Briggs
*Attorney, Agent, or Firm*—Lawrence R. Fraley

[57] ABSTRACT

An electrical connector assembly including a housing, a flexible circuit located within the housing and including first and second terminals thereon, a carriage movably positioned within the housing and designed for having a circuit board inserted therein, actuation means connected to the carriage to cause it to move and occupy first and second positions within the housing, and biasing means in the form of a pair of leaf springs which continuously exert biasing force against the carriage during its positioning within the invention's housing. As defined herein, contact is possible between a plurality of individual contact elements which form part of the circuit board and respective terminals located at one end portion of the flexible circuit. Second terminals located at the other end of the flexible circuit are designed for mating with and contacting respective conductors located on the second circuit device. Positive interconnection is thus possible between high density arrays of contact members in a compact structure.

17 Claims, 4 Drawing Sheets

CONNECTOR ASSEMBLY WITH MOVABLE CARRIAGE

TECHNICAL FIELD

The invention relates to electrical connector assemblies for receiving printed circuit boards (PCB's) therein, and particularly to such assemblies designed to provide zero insertion force (ZIF) at the time of board insertion between the board and respective contact elements located within the connector.

CROSS REFERENCE TO COPENDING APPLICATION S

In Ser. No. 07/266,538, entitled "Electrical Connector Assembly Including Pressure Exertion Member" (W. L. Brodsky et al) and filed Nov. 3, 1988, there is defined a connector assembly for connecting two circuit members (e.g., PCB's, flexible cables) wherein a pressure exertion member is utilized. The pressure exertion member includes a metallic base, a resilient member, and several compressible elements as part thereof. This pressure exertion member may be used in the present invention.

In Ser. No. 07/285,971, entitled "Electrical Connector Utilizing Flexible Electrical Circuitry" (A. D. Knight et al.), and filed Dec. 19, 1988, there is defined a connector assembly for connecting a flexible circuit (cable) to selected connectors on a substrate. A plurality (e.g., three) of pressure exerting means are utilized. This application also defines an assembly wherein paired flexible circuits are clamped against opposite surfaces of a PCB.

In Ser. No. 07/287,236, entitled "Connector For Connecting Flexible Film Integrated Circuit Carrier To Board Or Card And Use Thereof" (E. P. Dibble, et al), and filed Dec. 21, 1988, there is defined a connector for electrically connecting a circuit carrier to a card or board (e.g., PCB) wherein the connector (a contact, as referred to above) includes a pin having stem and head portions wherein the head includes a plurality (e.g., three) of raised contacting "dot" portions thereon for providing contact. Contacts of this type may be used within the instant invention.

All of the above-identified applications are assigned to the same assignee as the present invention.

BACKGROUND

Connectors of the zero (or extremely low) insertion force variety, otherwise referred to herein as ZIF connectors, are known in the art, with examples being described in U.S. Pat. Nos. 4,556,268 (Noschese), 4,626,056 (Andrews, Jr. et al), 4,629,270 (Andrews, Jr et al) 4,636,019 (Gillett et al) and 4,744,764 (Rubenstein). Such connectors, as in the case of U.S. Pat. Nos. 4,636,019, 4,626,056 and 4,629,270, are also capable of providing electrical connections between the circuit board (orcard) located therein and a flexible circuit member or the like which also forms part of this assembly. The use of such circuit members has recently gained widespread popularity in the industry (particularly the information processing industry) for several reasons, including particularly the relative freedom of packaging geometry while retaining high density and circuitry precision on a cost-affordable basis.

It is extremely important that in connectors of this type that sound, effective contact be completed between the several contacts therein and that such contact can only result from precise orientation of the members within the assembly. It is also considered essential, particularly in order to assure repeatability of connection, that such contact be achieved through a wiping or similar motion between the respective contacts to assure effective removal of contaminants and other debris which may accumulate therein over the passage of time during exposure to most working environments.

Assemblies capable of providing the above have typically been of relatively complex design, particularly in the camming structures used to actuate the positioned contacts. See, e.g., U.S. Pat. No. 4,629,270. As such, these connectors have been relatively expensive and difficult to assemble.

In accordance with the teachings herein, there is provided an electrical connector assembly capable of providing sound, effective connection between high density contacts forming part of the board and flexible circuit components of the assembly, as well as with a circuit device (e.g., printed circuit board) on which the invention is mounted. This connector, as will be defined, operates in a relatively simplistic fashion, is relatively inexpensive to produce, and thus represents a cost savings over connectors such as those cited in the several patents listed hereinabove. The invention also provides several other advantageous features as will be further understood from the following description.

It is believed that such a connector assembly will constitute a significant advancement in the art.

DISCLOSURE OF THE INVENTION

It is, therefore, a primary object of this invention to enhance the electrical connector art and particularly that section of the art devoted to information handling systems (computers).

It is an object of this invention to provide an electrical connector capable of providing, among others, the several highly advantageous features cited herein.

These and other objects are achieved by the provision of an electrical connector assembly in accordance with one aspect of the invention wherein the assembly is adapted for providing contact between at least one (and preferably several) contact on a circuit board and a corresponding conductor (again, preferably several) located on a circuit device (e.g., another circuit board). The assembly comprises a housing for being positioned adjacent the circuit device and including an opening therein, a flexible circuit member located substantially within said housing and including a first terminal thereon for engaging the contact element on the circuit board and a second terminal thereon electrically coupled to said first terminal and adapted for engaging the corresponding conductor on the circuit device, and a carriage movably positioned within the opening within the housing and including a slot therein for having the circuit board located therein. The carriage and the circuit board are capable of occupying a first position within the housing wherein the contact element on the board and the first terminal of the flexible circuit member are not engaged, and for moving to a second position wherein the contact element and the first terminal are engaged to provide electrical contact therebetween. The assembly further includes actuation means operatively connected to the carriage to cause the carriage and the circuit board to move from the first position to the second position, and biasing means secured to or forming part of the housing for biasing the carriage within the housing in a direction toward the flexible circuit member when the carriage occupies both the first and second positions and during the movement therebetween.

BEST MODE FOR CARRYING OUT THE INVENTION

For a better understanding of the present invention together with other and further objects, advantages and capailities thereof, reference is made to the following disclosure and appended claims in connection with the above described drawings.

Figure 1:
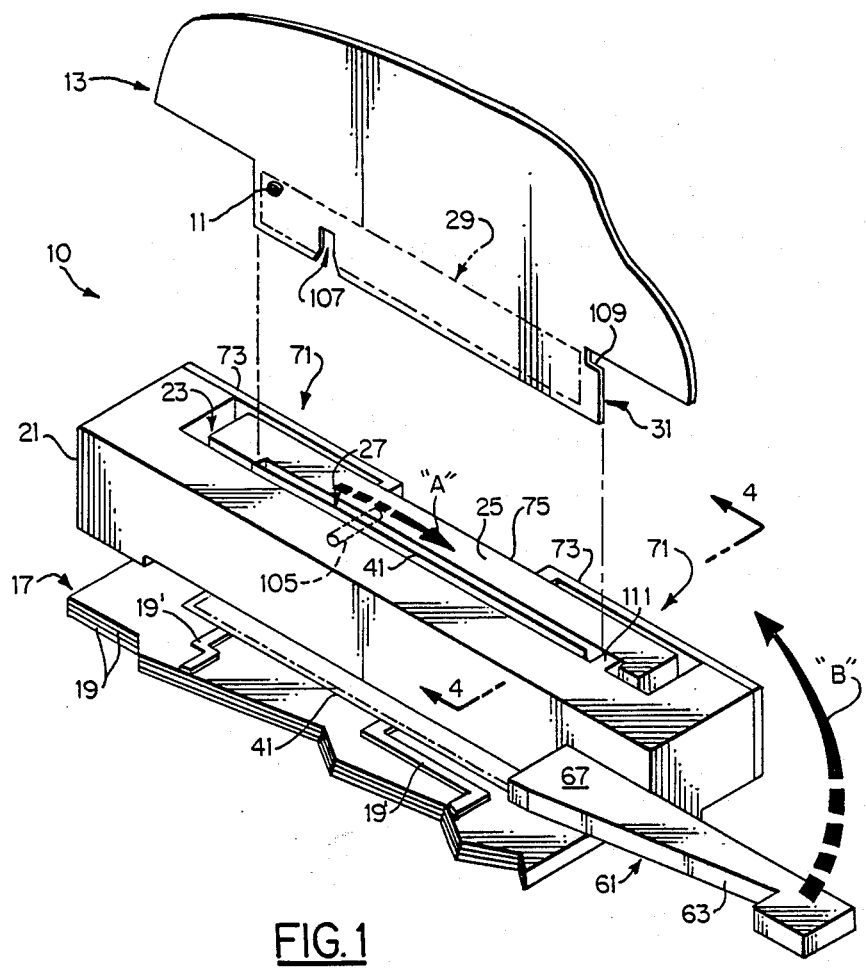
FIG. 1 is a perspective view of an electrical connector assembly in accordance with one embodiment of the invention.

In FIG. 1, there is shown an electrical connector assembly 10 in accordance with a preferred embodiment of the invention. As will be defined herein, connector assembly 10 is designed for providing electrical connection between contact elements 11 located on a circuit board 13 with respective conductors 15 (FIG. 2) located on a circuit device 17 (e.g., another circuit board). By the term circuit board as used herein is met to include a dielectric (e.g., epoxy resin) substrate having at least one and preferably several layers of conductive (e.g., copper) circuitry thereon/therein. Such structures are well known in the art and further description is not believed necessary. In the invention as defined herein, the defined circuit board 13 and circuit device 17 each include several such layers 19 which function (e.g., power, signal or ground) as is known in the art. It is understood that the invention is not limited to the particular number of such layers 19 as shown herein and that these are thus provided for illustration purposes only. In the preferred embodiment, however, several such layers are utilized and capable of being interconnected using the unique teachings of the instant invention.

Connector assembly 10 is shown to include an electrically insulative housing 21 for being positioned adjacent (e.g., atop) the circuit device 17. As such, housing 21 is preferably secured to device 17 (e.g., using attachment screws, clamps or the like, not shown). Housing 21 is preferably of plastic material (e.g., poly phenylene sulfide) and defines an elongated opening 23 therein. As defined below, opening 23 is designed to accommodate a carriage 25 which is movably positioned within the opening and, significantly, includes a slot 27 therein adapted for having circuit board 13 positioned therein. As understood from the following, the invention also provides means for positively retaining circuit board 13 within movable carriage 25 and even further includes polarization means to assure proper orientation of the respective contact elements 11 relative to the other working components of the invention.

Figure 2:
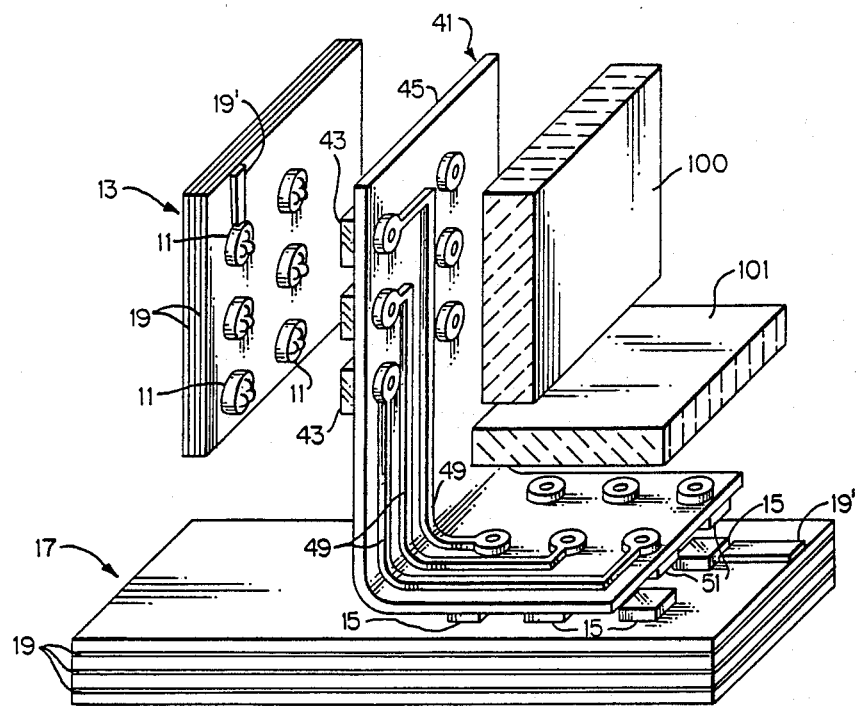
FIG. 2 is a pictorial view, on a larger scale, illustrating various components of the invention, but excluding others (e.g., the housing) to better illustrate the working relationships between said components.

As shown in FIG. 1, the contact elements 11 of circuit board 13 are positioned within a designated contacting area 29 (as illustrated by the phantom lines) located on an extending tab portion 31 of the board. As also shown in FIG. 2, a plurality of such contact elements, arranged in a predetermined pattern to thus occupy several rows within the contacting area 29, are utilized. By virtue of such an arrangement, a maximum number of connections can be made at this junction of the invention to thus provide the high density requirements strongly desired for designs of this type. In a preferred embodiment of the invention, a total of four hundred contact elements 11 are utilized on board 13. Contact elements 11, to be defined in greater detail below, are electrically connected to respective circuitry (e.g., one or more of the circuit layers 19 or a top surface layer 19' which may be connected electrically to a surface component or the like) to provide the necessary electrical connections herein. The provision of such contact elements 11 on a projecting end segment 31 or the like thus allows for greater utilization of board area at the remaining portions of the board which project above connector assembly 10 when the board is positioned within carriage 25.

Figure 3:
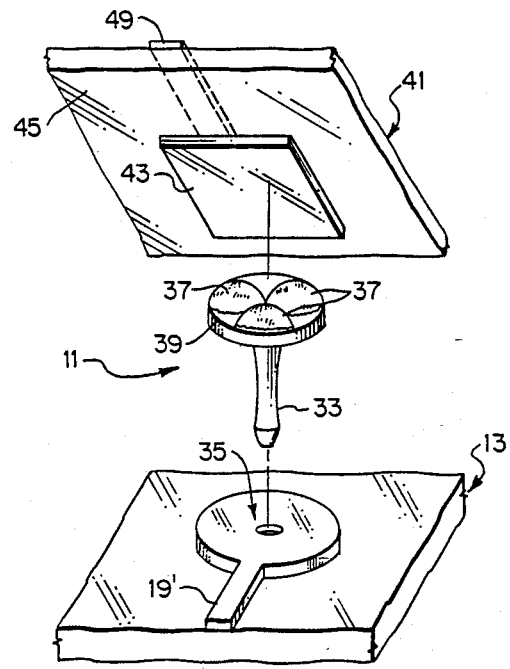
FIG. 3 is a much enlarged view illustrating the form of connection between the contact element and flexible circuit terminal of the invention.

In accordance with a preferred embodiment of the invention, each of the contact elements 11 of the invention comprise a pin-type member (FIG. 3) having an elongated stem portion 33 or the like designed for being inserted within a plated or similar electrically conductive aperture 35 within board 13. Each contact element 11 may be affixedly positioned within the respective aperture 35 within board 13 using solder or the like material. Alternatively, the head portion 39 may be used without stem portion 33 and attached directly (e.g., soldered) to the upper surface of the conductive aperture 35. Still further, stem portion may be of a compliant type and thus secured within aperture 35 without solder. As mentioned above, each contact element 11 may thus be connected to one or more of the individual circuit layers 19 located within board 13 and/or provide connection along a surface layer 19' (FIG. 3), thus adding appreciably to the overall functioning capability of the invention. As particularly shown in FIG. 3, each contact element 11 preferably includes a plurality of raised contact portions 37 formed on the head portion 39 of the element. As indicated, preferred contact elements for use in the invention are those defined in the aforementioned, filed application Ser. No. 287,236, entitled "Connector For Connecting Flexible Film Integrated Circuit Carrier To Board Or Card And Use Thereof", filed Dec. 21, 1988 and incorporated herein by reference. As defined in this application, each of the contact elements includes a raised contacting portion which is otherwise defined as a "hertz dot" portion. These portions are specifically designed for providing a concentrated force on the the material against which it rides. Such a contact arrangement serves to effectively displace contaminants which may adversely affect the provision of a sound effective contact at this location of the invention, and is thus highly desired. Placement of such elements within a relatively rigid circuit board component to thereby provide effective wiping contact against respective conductive elements in the invention is thus considered a significant feature of this invention. Such a feature is considered significant because, among other reasons, it eliminates the requirement for metal spring contacts as ar known in the art, such contacts requiring additional space within connectors of this type and thus adding to the overall size thereof. In addition, such spring contacts typically require relatively complicated camming mechanisms to effect actuation thereof. As understood herein, the instant invention substantially eliminates such requirements.

Figure 4:
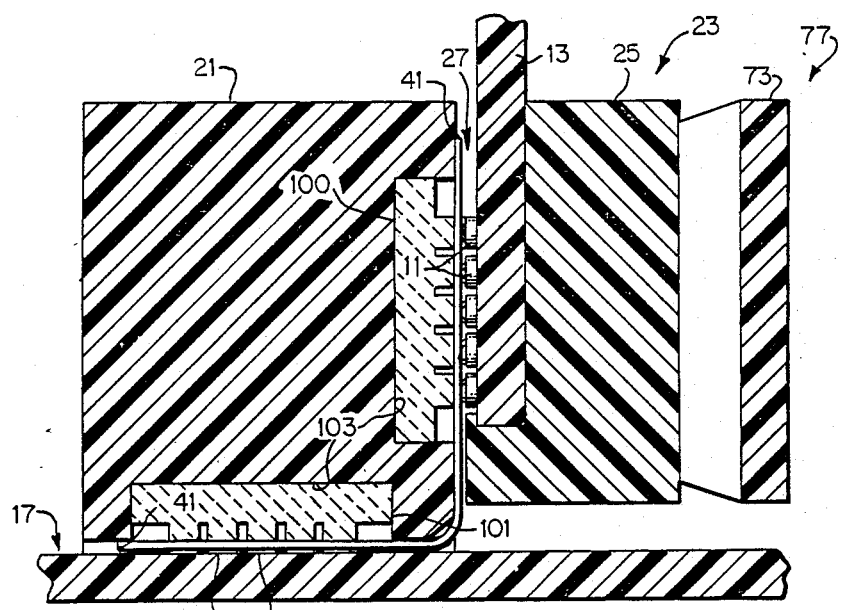
FIG. 4 is a side elevational view, in section, as taken along the line 4—4 in FIG. 1, illustrating the components of the invention following actuation of the invention's carriage.

As shown in FIGS. 1, 2 and 4, assembly 10 provides the defined connection between board 13 and device 17 using a flexible circuit member 41 which is located substantially within housing 21 (the housing not shown in FIG. 2 for illustration purposes) and includes a first terminal 43 thereon for being electrically contacted by a respective one of the raised contact elements 11. Preferably, a plurality of first terminals 43 are utilized, each adapted for contacting a respective one of a corresponding plurality of such contact elements 11. In a preferred embodiment of the invention, each first terminal 43 comprises a relatively flat copper member strategically positioned on a dielectric substrate 45 which forms part of flexible circuit member 41. Flexible circuit members are known in the art and, as used in the invention, preferably comprise at least two layers of conductive metal, a ground plane and a series of individual circuit lines separated by the aforementioned layer of dielectric material 45. Additional examples of flexible circuit members which may be used in the invention are described in some of the aforementioned patents. A preferred dielectric material 45 for flexible circuit member 41 is polyimide. Other suitable insulative materials are of course acceptable, as are other conductive (metallic) materials for the terminals used herein. Further description is thus not believed necessary.

As shown in FIG. 2, flexible circuit member 41, in addition to having the aforementioned first terminals 43 and dielectric substrate 45, further includes a plurality of external circuit lines 49 for electrically interconnecting a respective one or more of the first terminals 43 with respective second terminals 51 located at an opposing end segment of member 41. Each of the second terminals 51 is preferably similar in configuration and material to the aforementioned first terminals 43 and, as shown in FIG. 2, are preferably located on the same side of the dielectric substrate as the first terminals. Accordingly, each terminal 43 and 51 is electrically connected through the dielectric substrate to the respective circuit lines 49 on the opposite side of the substrate. Circuit lines 49, like terminal 43, are preferably of copper and formed on the dielectric substrate in a manner known in the art (e.g., additive plating or subtractive etching).

In accordance with a preferred embodiment of the invention, flexible circuit member 41 possesses an overall thickness of about 0.005 inch, and the corresponding heights of each of the respective first and second terminals 43 and 51 is within the range of about 0.001 inch to about 0.0015 inch from the respective surface of dielectric substrate 45. Although external surface lines 49 are shown as a means of interconnecting the respective terminals of the invention, it is also within the scope of the invention to provide such interconnection through internal layers (not shown) formed within the thin, flexible circuit.

As stated, assembly 10 also includes a carriage 25 which is movably positioned within opening 23 of housing 21 and which includes a slot 27 therein designed for having a projecting end segment 31 of board 13 inserted therein. Carriage 25 is also preferably of plastic material (e.g., poly phenylene sulfide). Carriage 25 is capable of occupying two positions within opening 23, the first of these being what will be referred to as a non-engagement position such that the inserted board 13 is spaceably located from the adjacent electrical circuit member. In this position, no engagement occurs between the conductive elements thereof. This first, non-engaging position is illustrated in greater detail in FIG. 6. Once board 13 is securedly positioned within slot 27, carriage 25 is moved (described below) to a second position (FIG. 7) such that effective, wiping contact engagement is made between the contact elements 1 located on board 13 and the respective first terminals (not shown in FIGS. 4–7 for clarification purposes) of flexible circuit 41. This wiping form of engagement, as stated, serves to displace contaminants and thus assure an effective connection between each contact element and respective first terminal. Significantly, this wiping engagement occurs in a direction substantially perpendicular to the direction of insertion of board 13 within housing 21 (and thus of elements 11).

Figure 6:
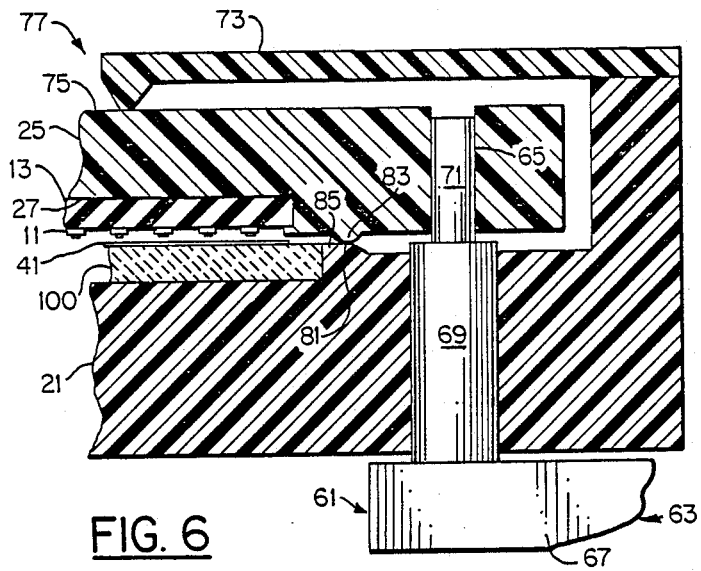
FIGS. 6 and 7 represent top, plan views, in section, showing the movement of the invention's carriage within the invention's housing, to provide the desired wiping engagement between respective contact and terminal members.
Figure 7:
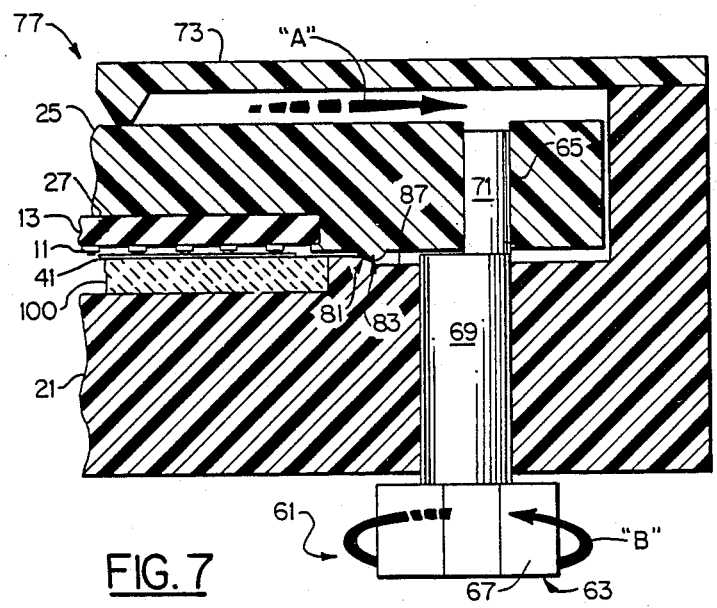

Movement of carriage 25 is accomplished utilizing an actuation means 61 which is operatively connected to the carriage to cause it and, significantly, the securedly positioned circuit board, to move in the defined manner. This direction is represented by the arrow "A" in FIGS. 1 and 7. As shown in FIGS. 1, 6 and 7, actuation means 61 comprises a moveable lever member 63 which in turn includes an eccentric shaft member 65 which extends from a rotational arm 67 located externally of housing 21. Rotation of arm 67 (in a counterclockwise fashion, represented by the arrow "B" in FIGS. 1 and 7) in turn causes rotation of eccentric shaft 65 in the manner show to move carriage 25 in a substantially linear direction (to the right in FIG. 7) within the housing's opening. As shown in FIG. 6 and 7, eccentric shaft 65 is of two-part construction, including a larger first section 69 extending substantially through housing 21 and a smaller offset section 71 projecting from the larger first section and being located within a corresponding opening within carriage 25. Shaft 65 and arm 67, like housing 21 and carriage 25, are also preferably of plastic material (e.g., poly phenylene sulfide).

To assure successful movement of carriage 25 in the manner defined herein, assembly 10 further includes biasing means 77 for biasing carriage 25 toward flexible circuit 41 when board 13 is located within slot 27. The biasing means of the invention serves to continuously force the carriage in a direction toward the flexible circuit during movement of the carriage within the invention's housing. This is considered significant for the reasons stated below. Biasing means 77, as shown, preferably comprises a pair of leaf spring members 73 located at opposite ends of housing 21 and, preferably, secured thereto. Each spring slidably engages the rear, outer surface 75 of carriage 25 to provide the continuous biasing force necessary. In a preferred embodiment of the invention, each spring is of plastic material (e.g., poly phenylene sulfide), and is preferably secured to a rear wall of housing 21 in the orientation manner shown. Alternatively, each leaf spring may form an integral part of the housing and thus represent an extension thereof. And yet another embodiment, each leaf spring may be of a metallic material and thus secured to the housing by suitable means (e.g., screws).

As shown in FIGS. 6 and 7, carriage 25 moves within housing 21 in a cam-like manner. This is accomplished by providing a cam surface 81 on housing 21 and a follower member 83 on carriage 25. The cam surface, as shown, is of stepped configuration such that the follower engages the first upper surface 85 during the first position of the carriage within housing 21 and is then slidably moved to a second surface 87 when the carriage occupies the second, engaging position shown in FIG. 7. It is also within the scope of the invention to provide a stepped cam surface on carriage 25 and the corresponding follower on a respective surface of the invention's housing 21. The aforementioned, unique movement represents a significant feature of the invention in that it enables a high density component (circuit board 13) having the defined, contact elements thereon to be precisely yet firmly moved within the housing to effect, in a positive manner, engagement with respective terminals located on a positioned flexible circuit member adjacent thereto. Such contact, as stated, is provided in a clean, effective manner between respective pluralities of contact and terminal members located in a high density array. Such engagement, as shown, is accomplished in a relatively simple yet effective manner, in comparison to the often complicated cam designs required in many of the aforementioned cited patents.

To further assure effective contact between the circuit board and flexible circuit member, as well as between the flexible circuit member and circuit device, a pair of pressure exerting means 100 and 101 are utilized in accordance with a preferred embodiment of the invention. Each pressure exerting means comprises an elastomeric pad which is located within a respective channel 103 or the like formed within housing 21. This channel and the corresponding elastomeric pad are preferably of rectangular, boxlike configuration (as shown) but may of course assume other configurations and still provide the desired capabilities herein. For example, each pressure exerting means 100 and 101 may be of the configuration defined in copending application Ser. No. 266,538, entitled "Electrical Connector Assembly Including Pressure Exertion Member", filed Nov. 3, 1988. This application is thus incorporated herein by reference. As defined therein, such a pressure exertion member may include a metallic base, a resilient member, and several individual compressible elements as part thereof. It is also possible to use a substantially solid, elastomeric member of a configuration depicted in FIG. 2 or, alternatively, one having the configuration depicted in FIGS. 4 and 5 wherein individual compressible segments are located adjacent each respective contact element 11 when the circuit board assumes the second, engaging position. The respective first and second terminals are not illustrated in FIGS. 4 and 5, for purposes of clarity. However, it is understood that each of the illustrated individual segments for the elastomeric pads 100 and 101 as shown therein (FIG. 4), is aligned behind a respective first and second terminal of the flexible circuit member. Each elastomeric pad thus serves to exert pressure against the flexible circuit member to assure positive engagement between the invention's contact elements and first terminals, as well as between the second terminals and the respective conductors 15 located on circuit device 17. In accordance with one embodiment of the invention, an average force of about 0.35 lbs. was applied to each of the respective terminals to provide contact. In the embodiment of FIG. 4, two elastomeric pads are utilized, one for each of the end portions of the flexible circuit member 41. As such, these pads are spaced apart from each other within the respective channels in housing 21.

Figure 5:
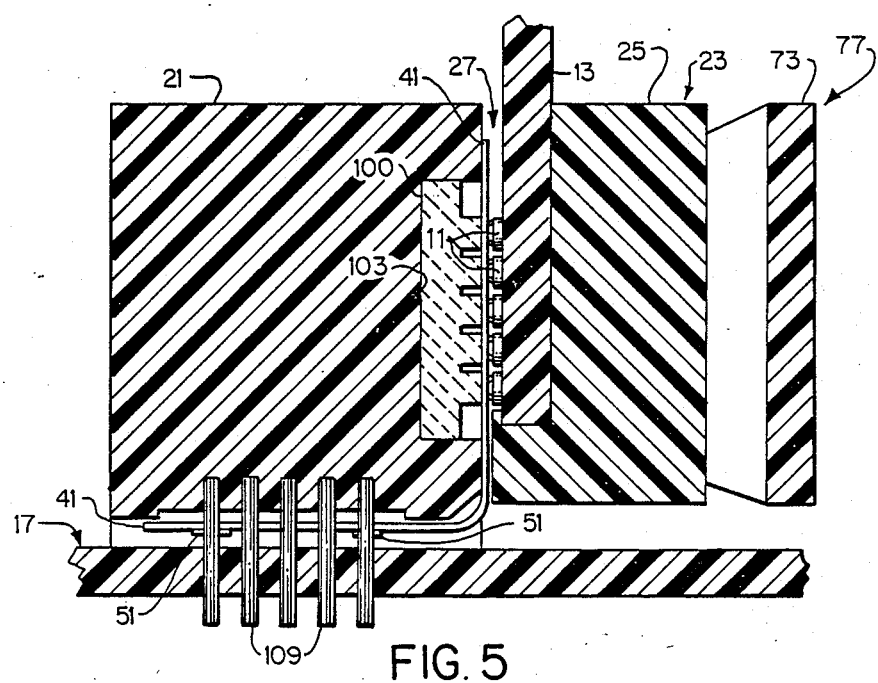
FIG. 5 is a side elevational view, also in section, similar to FIG. 4 but illustrating a different means of providing connection between the invention's flexible circuit member and circuit device, said means particularly adapted for providing effective, retention of the flexible circuit member.

In the embodiment of FIG. 5, only one elastomeric pad 100 is utilized. In this embodiment, a plurality of metallic pins 109 are securedly positioned within housing 21 and each designed for projecting therefrom and for being inserted within the illustrated end portion of the flexible circuit member 41 to in turn contact a respective one of the second terminals 51 located therein. Only two such terminals 51 ar shown for illustration purposes. Alternatively, each pin 109 may be inserted within the flexible circuit member to contact one or more of the internal circuit layers located therein, provided such a multilayered circuit member is utilized. Each metallic pin 109 is preferably copper or similar conductive material known in the art and is soldered to the respective second terminal. In addition, the pin is also soldered within an opening within device 17. In a preferred embodiment, this opening is a plated-through-hole (PTH) as are known in the art. Accordingly, each pin 109 is also capable of being electrically connected to one or more of the individual conductive layers (19 in FIG. 2) which may form a part of the circuit device 17. The arrangement depicted in FIG. 5 also enables positive restraint of the flexible circuit member to thereby prevent any unnecessary movement thereof.

As stated, circuit board 13 is securely positioned within carriage 25. This is accomplished, in accordance with one embodiment of the invention, utilizing an engagement member 105 (FIG. 1) in the form of a projecting pin which forms part of and extends from carriage 25. This pin is designed for aligning with an opening 107 located within the projecting end segment 31 of board 13. Polarization is thus assured due to the offset orientation of opening 107 relative to the respective ends of the projecting end segment. That is, the board 13 may be inserted within slot 27 such that only the individual contact elements 11 face in the proper direction (toward the flexible circuit member). To further assure retention of board 13, the projecting end segment 31 thereof includes a notch or similar opening 109 located therein which is designed for aligning with an extending tab 111 of housing 21. After initial insertion, the invention's actuation means 61 is slightly moved, counterclockwise, to begin initial movement of carriage 25. This movement in turn causes effective engagement between the tab 111 and slot 109 to thus prevent withdrawal of board 13 from slot 27. Continued rotation of actuation means 61 (specifically the rotational arm 67) in the counterclockwise direction "B" results in the aforedefined linear movement of carriage 25 (FIG. 7). Therefore, it is seen that in addition to providing the effective contact between the several conductive elements in the instant invention, the circuit board 13 is positively retained within the invention's housing and thus cannot be removed therefrom. Eventual board replacement can be accomplished by returning the invention's actuation means to its original position (FIG. 1), whereupon the board 13 can be grasped and vertically removed.

Thus there has been shown and described an electrical connector assembly specifically designed for providing effective contact between the contact elements of a circuit board positioned therein and respective conductors located on a circuit device (e.g., a second circuit board) using a flexible circuit member. The invention as defined is of relatively simple configuration in comparison to existing structures and is capable of being operated in a relatively simple manner. Although the invention has been defined in broad terms such that interconnection is provided between at least one conductive member on each of these board components, the invention readily enables the connection of several of such members so as to assure a high density structure desired in many of today's environments. The aforementioned highly advantageous features are provided in a design which is extremely compact and which is readily adaptable to many existing circuit device and/or board structures.

While they have been shown and described with our at present considered the preferred embodiments of the invention, it will be obvious to those skilled in the art that various changes and modifications may be made therein without departing from the scope of the invention as defined by the appended claims.

What is claimed is:

1. An electrical connector assembly for providing electrical connection between at least one contact element on a circuit board and a corresponding conductor located on a circuit device, said connector assembly comprising:
    a housing for being positioned adjacent said circuit device and including an opening therein;
    a flexible circuit member located substantially within said housing and including a first terminal thereon for engaging said contact element on said circuit board and a second terminal thereon electrically coupled to said first terminal and adapted for engaging said corresponding conductor on said circuit device;
    a carriage movably positioned within said opening within said housing and including a slot therein for having said circuit board located therein, said carriage and said circuit board occupying a first position within said housing wherein said contact element on said board and said first terminal of said flexible circuit member are not engaged, said carriage and said circuit board adapted for moving to a second position wherein said contact element and said first terminal are engaged to provide electrical contact therebetween;
    actuation means operatively connected to said carriage to cause said carriage and said circuit board to move from said first position to said second position; and
    biasing means secured to or forming part of said housing for biasing said carriage within said housing in a direction toward said flexible circuit member when said carriage occupies both said first and second positions within said housing and during said movement between said first and second positions.

2. The assembly of claim 1 wherein said contact element on said circuit board includes a plurality of raised contacting portions for engaging said second terminal on said flexible circuit member, said second terminal being of substantially flat configuration.

3. The assembly of claim 2 wherein said raised contacting portions engage said first terminal in a wiping motion, said wiping motion occurring in a direction substantially perpendicular to the direction of insertion of said circuit board within said housing.

4. The assembly of claim 1 including a first pressure exerting member located within said housing adjacent the portion of said flexible circuit member having said first terminal thereon for exerting pressure against said first terminal when said first terminal is engaged by said contact element in said circuit board.

5. The assembly of claim 4 wherein said pressure exerting member is an elastomeric pad, said housing including a channel therein, said elastomeric pad being oriented within said channel.

6. The assembly of claim 3 including a second pressure exerting member located within said housing at a spaced location from the first pressure exerting member and adjacent the portion of said flexible circuit having said second terminal thereon for exerting pressure on said second terminal against said corresponding conductor on said circuit device.

7. The assembly of claim 6 wherein said second pressure exerting member is an elastomeric pad, said housing including a channel therein, said elastomeric pad being located within said channel.

8. The assembly of claim 3 wherein said second terminal and said corresponding conductor in said circuit device are fixedly secured together.

9. The assembly of claim 8 wherein said second terminal and said corresponding conductor are soldered.

10. The assembly of claim 8 wherein said corresponding conductor comprises a metallic pin securely positioned within said housing, said pin passing through said flexible circuit member.

11. The assembly of claim 1 wherein said carriage includes an engagement member for physically engaging said circuit board when said board is located within said slot.

12. The assembly of claim 11 wherein said circuit board includes an opening therein and said engagement member includes a projecting pin, said projecting pin adapted for being positioned within said circuit board opening to enable said physical engagement to occur between said circuit board and said engagement member.

13. The assembly of claim 1 wherein said biasing means comprises a pair of leaf springs secured to said housing for slidably engaging an external surface of said carriage.

14. The assembly of claim 1 wherein said actuation means comprises a movable lever member including a rotational arm and an eccentric shaft, said shaft extending through said housing and into said carriage, rotation of said arm and said eccentric shaft causing said carriage to move in a linear manner within said housing.

15. The assembly of claim 14 wherein said carriage moves within said housing against a surface of said housing in a cam-like manner.

16. The assembly of claim 15 wherein said surface of said housing having said carriage moving thereagainst includes a cam surface and said carriage includes a follower member thereon for slidably engaging said cam surface during said movement.

17. The assembly of claim 16 wherein said cam surface is of stepped configuration.

* * * * *